United States Patent
Ohama et al.

(10) Patent No.: US 7,686,887 B2
(45) Date of Patent: *Mar. 30, 2010

(54) QUARTZ GLASS CRUCIBLE FOR PULLING UP SILICON SINGLE CRYSTAL AND METHOD FOR PRODUCING THE SAME

(75) Inventors: Yasuo Ohama, Takefu (JP); Takayuki Togawa, Takefu (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 1358 days.

This patent is subject to a terminal disclaimer.

(21) Appl. No.: 10/523,319

(22) PCT Filed: Jul. 30, 2003

(86) PCT No.: PCT/EP03/08422

§ 371 (c)(1),
(2), (4) Date: Jan. 31, 2005

(87) PCT Pub. No.: WO2004/013384

PCT Pub. Date: Feb. 12, 2004

(65) Prior Publication Data

US 2005/0235907 A1   Oct. 27, 2005

(30) Foreign Application Priority Data

Jul. 31, 2002   (JP) ............................. 2002-223999

(51) Int. Cl.
- C30B 15/10 (2006.01)
- F27B 14/10 (2006.01)
- C03B 11/00 (2006.01)
- C03B 15/00 (2006.01)
- C03B 19/01 (2006.01)

(52) U.S. Cl. .................. 117/208; 117/200; 117/900; 117/932; 65/17.3; 65/17.4; 432/262; 432/264; 432/265

(58) Field of Classification Search ............... 117/206, 117/200, 213

See application file for complete search history.

(56) References Cited

U.S. PATENT DOCUMENTS 4,528,163 A * 7/1985 Albrecht .................... 117/208

(Continued)

FOREIGN PATENT DOCUMENTS

EP   1 024 118 A   8/2000

(Continued)

OTHER PUBLICATIONS

Machine language Translation of Tsuji et al (Japanese Patent Publication 2002-284596).*

(Continued)

*Primary Examiner*—Jason L. Lazorcik
(74) *Attorney, Agent, or Firm*—Tiajoloff and Kelly LLP

(57) ABSTRACT

An object of the invention is to provide a quartz glass crucible reduced in the generation of vibration occurring on the surface of a silicon melt and free from the generation of rough surface and cristobalite spots, yet capable of pulling up single crystal silicon stably and at high yield even in long-term operations; it is also an object to provide a method for producing the same. In a quartz glass crucible for pulling up single crystal silicon comprising a crucible base body having a bottom part and a straight shell part with an inner layer provided to the inner surface thereof, the quartz glass crucible is characterized by that said inner layer comprises a synthetic quartz glass layer from the lowest end to at least a height of 0.25 H; a naturally occurring quartz glass layer or a mixed layer of naturally occurring quartz glass and synthetic quartz glass extended in a range of from at least 0.5 H to 0.8 H; and one selected from a synthetic quartz glass layer, a naturally occurring quartz glass layer, and a mixed quartz glass layer of naturally and synthetic quartz glass for the rest of the inner layer; wherein H represents the height from the lowest end of the bottom part to the upper end plane of the shell part. It also provides a method for producing the quartz glass crucible above.

4 Claims, 2 Drawing Sheets

U.S. PATENT DOCUMENTS

| | | | |
|---|---|---|---|
| 4,572,729 A * | 2/1986 | Lang et al. | 65/17.3 |
| 5,141,786 A * | 8/1992 | Shimizu et al. | 428/34.5 |
| 5,174,801 A * | 12/1992 | Matsumura et al. | 65/17.3 |
| 5,302,556 A * | 4/1994 | Shimizu et al. | 501/12 |
| 5,306,388 A * | 4/1994 | Nakajima et al. | 117/208 |
| 5,306,473 A * | 4/1994 | Nakajima et al. | 117/208 |
| 5,730,800 A * | 3/1998 | Sato et al. | 118/200 |
| 5,980,629 A * | 11/1999 | Hansen et al. | 117/13 |
| 5,989,021 A * | 11/1999 | Sato et al. | 432/264 |
| 6,136,092 A * | 10/2000 | Sato et al. | 117/84 |
| 6,280,522 B1 * | 8/2001 | Watanabe et al. | 117/29 |
| 6,306,489 B1 * | 10/2001 | Hellmann et al. | 428/312.6 |
| 6,548,131 B1 * | 4/2003 | Fabian et al. | 428/34.4 |
| 6,641,663 B2 | 11/2003 | Kemmochi et al. | |
| 6,797,061 B2 * | 9/2004 | Sato et al. | 117/208 |
| 6,841,210 B2 | 1/2005 | Ohama et al. | |
| 6,886,364 B2 * | 5/2005 | Ohama et al. | 65/17.3 |
| 6,916,370 B2 * | 7/2005 | Watanabe | 117/13 |
| 7,299,658 B2 * | 11/2007 | Ohama et al. | 65/374.11 |
| 2002/0192409 A1 | 12/2002 | Ohama et al. | |
| 2003/0012899 A1 | 1/2003 | Kemmochi et al. | |
| 2003/0074920 A1 | 4/2003 | Ohama et al. | |
| 2003/0106491 A1 | 6/2003 | Kemmochi et al. | |
| 2004/0072007 A1 * | 4/2004 | Kemmochi et al. | 428/544 |

FOREIGN PATENT DOCUMENTS

| | | | |
|---|---|---|---|
| EP | 1 319 736 A1 | | 12/2002 |
| JP | 2811290 | | 8/1998 |
| JP | 2933404 | | 5/1999 |
| JP | 2001-348240 | | 12/2001 |
| JP | 2001 348294 A | | 12/2001 |
| JP | 2002-348294 | | 12/2001 |
| JP | 2002-284596 | | 10/2002 |
| JP | 2002284596 A | * | 10/2002 |
| JP | 2003-95678 | | 4/2003 |
| WO | WO 01/92169 A1 | | 12/2001 |
| WO | WO 01 92609 A | | 12/2001 |

OTHER PUBLICATIONS

Espacenet English abstract for JP 05-510577 (Apr. 27, 1993).
Espacenet English abstract for JP 08-169798 (Jul. 2, 1996).
Patent Abstracts of Japan, for JP 2003-095678 (Apr. 3, 2003).
Patent Abstracts of Japan, for JP 2001-348294 (Dec. 18, 2001).
Patent Abstracts of Japan, for JP05-105577 (Apr. 27, 1993).
Patent Abstracts of Japan, for JP 2002-284596 (Oct. 3, 2002).
Patent Abstracts of Japan, for JP08-169798 (Jul. 2, 1996).
Patent Abstracts of Japan, for JP2001-348240 (Dec. 18, 2001).

* cited by examiner

[Fig. 1]
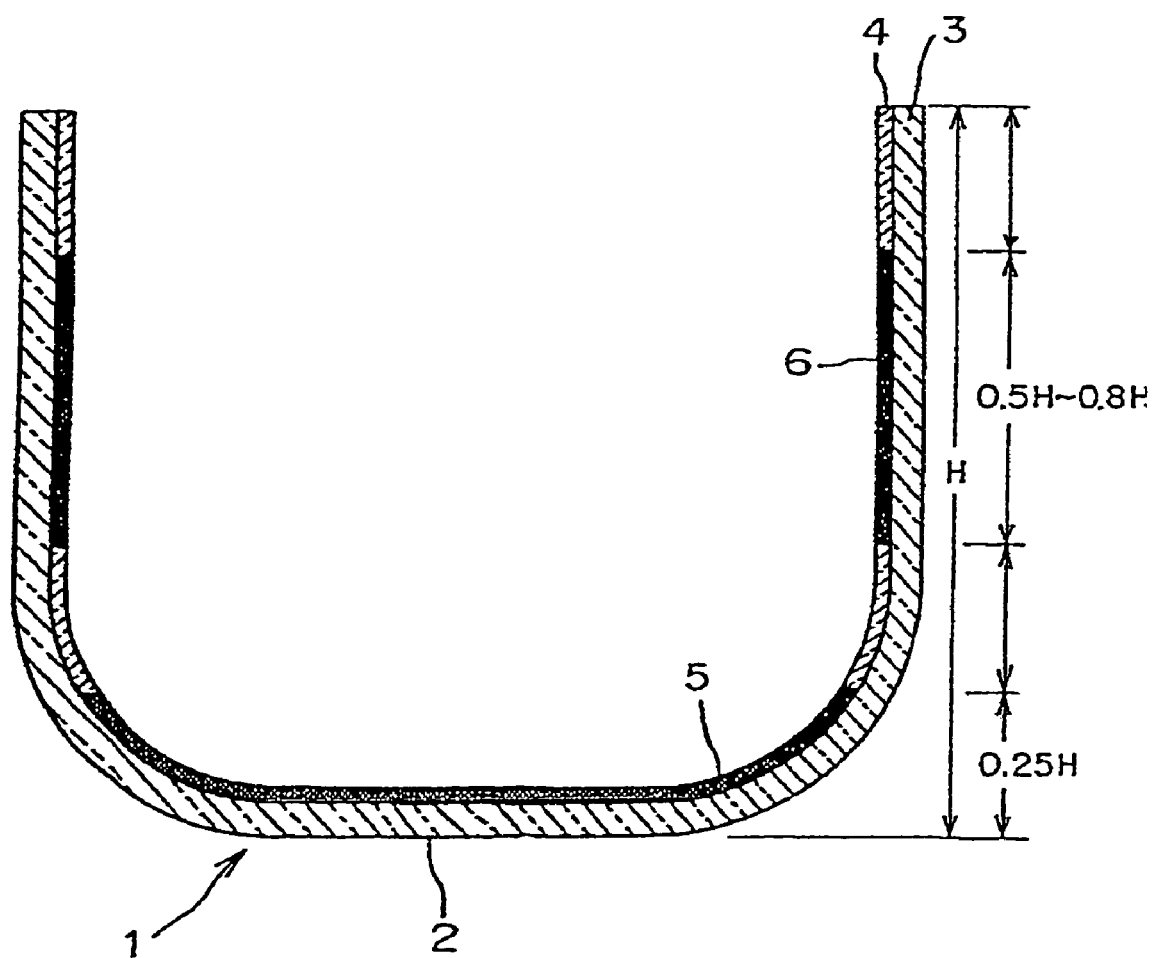

[Fig. 2]
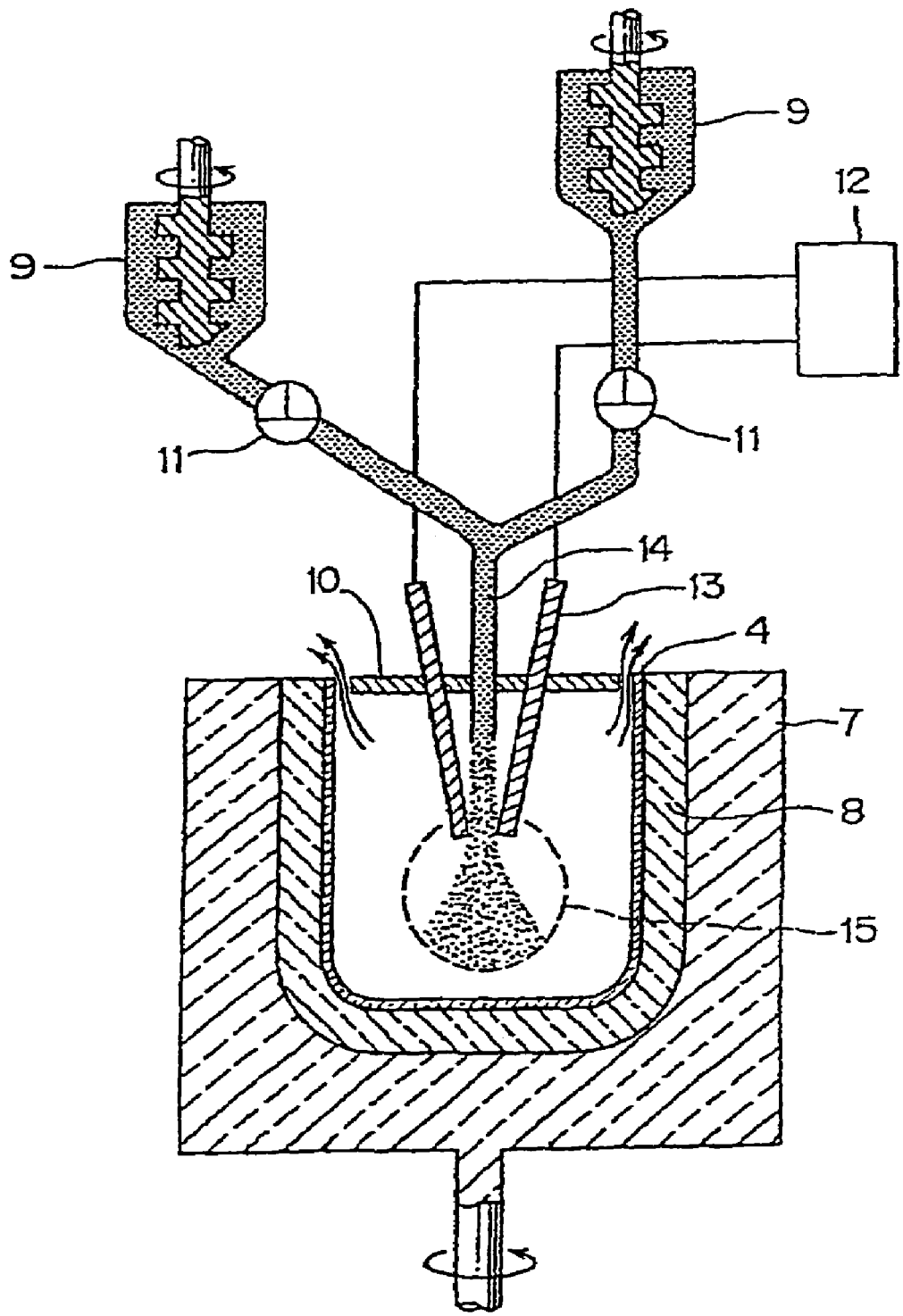

QUARTZ GLASS CRUCIBLE FOR PULLING UP SILICON SINGLE CRYSTAL AND METHOD FOR PRODUCING THE SAME

The present invention relates to a quartz glass crucible for pulling up single crystal silicon, comprising a crucible base body having a bottom part and a side wall, with an inner layer provided to the inner surface thereof.

Furthermore the invention is related to a method for producing a quartz glass for pulling up single crystal silicon comprising a crucible base body having a bottom part and a side wall enclosing an inner cavity portion, by setting a high temperature atmosphere inside the cavity portion of the quartz glass crucible base body being attached to a rotating mold, and supplying a silica powder into said high temperature atmosphere to form an inner layer on the inner surface of the crucible base body by melting and vitrifying the silica powder.

Conventionally, so-called Czochralski (CZ) method is widely employed heretofore as the production method for silicon single crystals. The CZ method comprises melting polycrystalline silicon in a crucible made of quartz glass, immersing a seed crystal of silicon single crystal into the silicon melt, gradually pulling up the seed crystal while rotating the crucible, and thereby growing the single crystal silicon from the seed crystal as core. The single crystal that is produced in said CZ method should be of high purity and capable of producing silicon wafers at high yield; as the quartz glass crucible for use in the production, employed is a double-structured quartz glass crucible comprising an inner layer free from pores and an opaque outer layer containing pores.

With recent tendency of consuming longer time for the operation of pulling up single crystals with increasing diameter of silicon single crystals, quartz glass crucibles with higher purity are required. Accordingly, the present applicants have proposed a quartz glass crucible having a double structure comprising a transparent inner layer and an opaque outer layer, in which the inner layer is formed with synthetic silica powder (for instance, U.S. Pat. No. 2,811,290 and U.S. Pat. No. 2,933,404, etc.). A quartz-glass crucible having an inner layer made from synthetic quartz glass is advantageous in that it is extremely low in impurity content, suffers very low generation of surface roughening or cristobalite spots on the inner surface during pulling up silicon single crystals, enables operation for a long time, and increases the yield of pulling up single crystals.

However, in case of melting polysilicon, when compared with crucibles made from naturally occurring quartz, the crucibles above having inner layers made of synthetic quartz glass tends to cause oscillation on the surface of the melt. In particular, such surface oscillation is frequently observed in the initial pulling up stages such as nucleation, formation of shoulders, and former stages of producing single crystal body part; and is disadvantageous in that it lowers productivity, due to increased time for nucleation, the generation of disordering in the crystals, causing re-melting, i.e., the so-called meltback, and the like. In the light of such circumstances, the present inventors have proposed a multi-layer structured crucible having an opaque synthetic quartz glass preliminary layer interposed between a transparent inner layer made of synthetic quartz glass and an opaque bulk layer made of naturally occurring quartz glass (Japanese Patent Laid-Open No. 2001-348294). However, since multi-layer structured crucible uses expensive synthetic powder in large quantities, it suffered a disadvantage as such that it results expensive.

In the light of the aforementioned circumstances, the present inventors have extensively conducted studies, and as a result, it has been found that the surface vibration generated on the surface of the silicon melt is deeply related with the inner surface of the wall (straight shell part), and that the yield of pulling up single crystals is significantly related with the inner surface of the bottom part. Furthermore, by using naturally occurring quartz glass or a mixture of naturally occurring and synthetic quartz glasses for a specified part of the wall the quartz glass crucible that is used for pulling up silicon single crystals, it has been found that the generation of vibration on the surface of the silicon melt can be suppressed, and that it enables long stabilized operation using the crucible while suppressing the generation of surface roughening and cristobalite spots on the inner surface of the crucible by forming a specified range of the inner layer in the vicinity of the bottom part of the crucible with synthetic quartz glass. The present invention has been accomplished based on these findings enabling pulling up of silicon single crystal at high yield. More specifically:

An object of the present invention is to provide a quartz glass crucible capable of pulling up silicon single crystal stably at high yield by suppressing the generation of vibration on the surface of silicon melt, without generating surface roughening and cristobalite spots on the inner surface of the crucible even for long operation.

Further object of the present invention is to provide a method for producing the quartz glass crucible above.

In order to achieve the objects above, the quartz glass crucible is characterized in that its inner layer comprises
  a) a first part made of a synthetic quartz extending from the bottom to at least a height of 0.25 H;
  b) a second part made of a naturally occurring quartz glass or made of mixed quartz glass of naturally and synthetic quartz glass, extending in a range of from at least 0.5 H to 0.8 H;
  c) and a residual part made of quartz glass selected from a synthetic quartz glass, a naturally occurring quartz, or a mixed quartz glass of naturally and synthetic quartz glass,
  wherein H represents the height from the lowest side of the bottom part to the upper end plane of the wall.

The quartz glass crucible according to the present invention is a quartz glass crucible for pulling up single crystal silicon comprising a crucible base body with an inner layer provided to the inner surface of the bottom an the side wall, in which said inner layer comprises, with respect to the height (H) from the lowest end of the bottom part to the upper end plane of the side wall, a first layer which is a synthetic quartz glass layer of at least up to a height of 0.25 H; a second layer made of naturally occurring quartz glass or a mixed quartz glass of naturally occurring quartz glass and synthetic quartz glass extending over a range of at least from 0.5 H to 0.8 H; and the rest of the inner layer is formed by a residual layer consisting of one selected from synthetic quartz glass, a naturally occurring quartz glass, and a mixed quartz glass of naturally occurring quartz glass and synthetic quartz glass.

By providing a part (second part) of the inner layer made of naturally occurring quartz glass or synthetic glass containing naturally occurring glass (i.e., a naturally occurring glass mixed with synthetic glass) on the inner surface of the crucible base body, the vibration in silicon melt can be suppressed.

The thickness of the second part is preferably in a range of from 0.3 to 3 mm. In case the thickness is less than 0.3 mm, only small effect of suppressing the vibration of silicon melt can be expected; a second part at a thickness exceeding 3 mm is not preferred because there is no improvement in the effect of suppressing the vibration of the melt.

On the other hand, the yield of the silicon single crystal depends on whether the single crystal contains dislocations or not. However, most of the dislocations generate due to the surface roughening or to the generation of cristobalite spots in the later stage of the pulling up process, i.e., within a height of 0.25 H of the crucible that is brought into contact with the silicon melt for a long duration of time. Accordingly, in the quartz glass crucible according to the present invention, the first part of the inner layer up to a height of at least 0.25 H is formed with synthetic quartz glass that is less affected by surface roughening or generation of cristobalite spots.

The thickness of the first part of the inner layer is preferably in a range of from 0.5 to 5 mm. In case the thickness of the first part becomes less than 0.5 mm, the effect of suppressing surface roughening and cristobalite spots becomes small as to result in low yield. An thickness exceeding 5 mm is also not preferred, because it increases the production cost.

The powder of naturally occurring silica mixed with synthetic glass for forming the inner layer of the quartz glass crucible above preferably contains 30% or more of naturally occurring silica powder.

The quartz glass crucible for pulling up silicon single crystals according to the present invention suffers less vibration of silicon melt surface on pulling up silicon single crystals and enables stable pulling up silicon single crystals at high yield without causing surface roughening or generation of cristobalite spots on the inner surface of the crucible.

Concerning the method the above mentioned object is met by a production method which is characterized in that the forming of the inner layer comprises
  a) forming of a first part of the inner layer extending from the bottom to at least a height of 0.25 H which is made of a synthetic quartz glass;
  b) forming of a second part of the inner layer, extending in a range of from at least 0.5 H to 0.8 H, which is made of a naturally occurring quartz glass or a mixed quartz glass of naturally and synthetic quartz glass;
  c) forming of a residual part of the inner layer, made from a quartz glass selected from a synthetic quartz glass, a naturally occurring quartz glass, and a mixed quartz glass of naturally and synthetic quartz glass, wherein H represents the height from the lowest end of the bottom part to the upper end plane of the wall.

A first part of the inner layer is formed to at least a height of 0.25 H by supplying synthetic silica powder in a high temperature atmosphere and by melting and vitrifying the powder. Followed by moving upward, downward, or to the right or left, if necessary, a silica powder supply nozzle that has been used for supplying the synthetic silica powder, and then forming, over a height range of at least 0.5 H to 0.8 H, a second part of the inner layer consisting of naturally occurring quartz glass or of naturally occurring quartz glass mixed with synthetic quartz glass, This is achieved by supplying a powder of naturally occurring silica or of naturally occurring silica mixed with synthetic silica from the supply nozzle.

Here and in the following "H" represents the height from the lowest end of the bottom part to the upper end plane of the side wall as it is shown in more detail in FIG. 1.

Alternatively the second part of the inner layer is produced first by melting and vitrifying a powder of naturally occurring silica or of naturally occurring silica mixed with synthetic silica that is supplied from a silica powder supplying nozzle, followed by moving, if necessary, upward, downward, or to the right or left the silica powder supply nozzle and then forming the first part of the inner layer, which is a synthetic quartz glass layer having a height of at least a 0.25 H from the lowest end of the outer surface of the bottom part by melting and vitrifying the synthetic silica powder supplied from the silica powder supplying nozzle.

In a preferred d method a preliminary quartz glass layer is formed over the entire inner surface of the crucible base body by melting and vitrifying a silica powder which is a synthetic silica powder, whereby the second part of the inner layer is formed over a height range of from 0.5 H to 0.8 H is formed by coating the preliminary layer with a second quartz glass layer made from naturally occurring silica powder or a powder of naturally occurring silica mixed with synthetic silica.

Alternatively a preliminary quartz glass layer is formed over the entire inner surface of the crucible base body by melting and vitrifying a silica powder which is a naturally occurring silica powder or a powder of naturally occurring silica mixed with synthetic silica powder, whereby the first part of the inner layer is formed over a height range to at least 0.25 H is formed by coating the preliminary layer with a second quartz glass layer made from synthetic silica powder.

The quartz glass crucible can be produced by a simple production method comprising supplying a synthetic silica powder, a naturally occurring silica powder, or a mixed powder of naturally occurring silica and synthetic silica to each of the portions of the crucible base, and then melting and vitrifying each of the powders for forming the several parts of the inner layer.

The present invention is described more specifically below by way of examples, but it should be understood that the present invention is not only limited thereto.

FIG. 1 shows a schematically drawn cross section view of the quartz glass crucible of the present invention.

FIG. 2 is a schematic drawing of the method for producing the quartz glass crucible of the present invention.

The structure of the quartz glass crucible according to the present invention is shown in FIG. 1.

In FIG. 1 are shown a quartz glass crucible 1, bottom part 2 of the crucible, side wall 3 forming a straight shell and inner layer 4, consisting of a first part which is a synthetic quartz glass layer 5, a second part, which is a layer 6 made of naturally occurring quartz glass (or alternatively it is made of naturally occurring glass mixed with synthetic glass) and a residual layer at the upper end and between first part 5 and second part 6.

FIG. 2 shows the method for producing the quartz glass crucible according to the invention.

In FIG. 2 are shown a rotating mold 7, a crucible base body 8, a means for supplying silica powder 9, a plate-like lid body 10, a flow control valve 11, a power supply 12, an arc electrode 13, a silica powder supply nozzle 14, and high temperature atmosphere 15.

The quartz glass crucible according to the present invention is formed by introducing naturally occurring silica powder from the silica powder supply means 9 into the rotating mold 7, shaping the powder into the form of the crucible, inserting the arc electrode 13 therein, and covering the aperture part of the body shaped into the crucible with a plate-like lid body 10, and thus, by using the arc electrode 13, a translucent crucible base body 8 is formed by setting the inside cavity of the crucible-like shaped body to a high temperature gaseous atmosphere and thereby melting and vitrifying at least a partially the inside of the crucible-like shaped body.

Then, a first silica powder is supplied into the high temperature atmosphere 15 from the silica powder supply means 9 while controlling the supply rate with the flow control valve 11 to thereby form a quartz glass inner layer at the desired position by melting and vitrifying the powder.

Subsequently, a synthetic silica powder is supplied to the high temperature atmosphere 15 from the silica powder supply nozzle 14, and, on forming a quartz glass layer (first part 5) at the desired position by melting and vitrifying the thus supplied silica powder, thereby forming a synthetic quartz glass inner layer 5 up to a height of 0.25 H from the lowest end of the outer surface of the bottom part. "H" represents the height from the lowest end of the bottom part to the upper end plane of the side wall.

In the same way and by using naturally occurring quartz glass powder, a second part 6 of the inner is formed on the wall in a range from 0.5 H to 0.8 H consisting of naturally occurring quartz glass layer.

The rest of the inner layer 4 is formed with one kind of quartz glass selected from a synthetic quartz glass, a naturally occurring quartz glass, or a naturally occurring quartz glass mixed with synthetic quartz glass.

There are several preferred production methods such as (i): a method comprising forming a first part of the inner quartz glass layer to at least a height of 0.25 H by supplying synthetic silica powder in a high temperature atmosphere and by melting and vitrifying the powder, followed by moving upward, downward, or to the right or left, if necessary, the silica powder supply nozzle 14 that has been used for supplying the synthetic silica powder, and forming, over a height range of at least 0.5 H to 0.8 H a naturally occurring quartz glass powder or a mixture of naturally occurring quartz glass and synthetic quartz glass 6 from the nozzle 14 in order to produce the second part 6 of the inner layer 4;

(ii) a method comprising forming the second part 6 of the inner layer 4 over a height range of at least 0.5 H to 0.8 H by melting and vitrifying a powder of naturally occurring silica or of naturally occurring silica mixed with synthetic silica that is supplied from a silica powder supplying nozzle 14, followed by moving, if necessary, upward, downward, or to the right or left the silica powder supply nozzle 14, and then forming the first part 5 of inner layer 5 to at least a height of 0.25 H from the lowest end of the outer surface of the bottom part by melting and vitrifying synthetic silica powder supplied from the silica powder supplying nozzle 14; and (iii) a method comprising forming a preliminary quartz glass inner layer over the entire inner surface of the crucible base body by melting and vitrifying a first silica powder supplied from the silica powder supply nozzle 14, followed by forming a second quartz glass inner layer on the desired position by supplying a second silica powder.

In the production method (iii), preferred are to use synthetic silica powder for the first powder and a naturally occurring silica powder or a powder of naturally occurring silica mixed with synthetic silica for the second powder, such that the second part of the inner layer 6 made of naturally occurring quartz glass or of naturally occurring quartz glass mixed with synthetic quartz glass is formed over a height range of from 0.5 H to 0.8 H.

Example 1

By using the apparatus shown in FIG. 2, high purity naturally occurring silica powder subjected to purification treatment was fed into a rotating mold 7, and the powder was formed into a quartz glass crucible-like shape by the centrifugal force. Then, an arc electrode 13 was inserted into the quartz glass crucible base body, the aperture part was covered with a platy lid body 10, and a high temperature gaseous atmosphere was provided inside the inner cavity by using the arc electrode 13 to melt and vitrify the base body. Thus, a translucent quartz glass crucible base body 8 was formed by cooling the molten and vitrified body. Then, after setting high temperature atmosphere 15 inside the inner cavity of the translucent quartz glass crucible base body 8 by means of arc electrode 13 while rotating the mold 7, synthetic silica powder was supplied therein at a rate of 100 g/min from the silica powder supply nozzle 14. In this manner, a synthetic quartz glass inner layer 5 about 2 mm in thickness was molten and joined monolithically with the inner surface of the translucent crucible base body 8 to a height of at least 0.4 H from the lowest end of the outer surface of the bottom part, where H represents the height from the lowest end of the bottom part to the upper end plane of the shell part. Then, the silica powder supply nozzle 14 was moved upward, and by supplying a powder of naturally occurring silica at a rate of 100 g/min from a silica powder supply means 9, a naturally occurring quartz glass inner layer 6 about 2 mm in thickness was molten and joined monolithically with the inner surface of the translucent crucible base body 8 over a height range of 0.4 H to 1.0 H. The diameter of the thus obtained quartz glass crucible was 24 inches. On pulling up single crystal according to CZ method by filling the quartz glass crucible with polycrystalline silicon and melting, perfect single crystal was obtained after operation of about 90 hours without generating any vibration on the surface of silicon melt.

Example 2

High purity naturally occurring silica powder subjected to purification treatment was fed into a rotating mold to form the powder into a quartz glass crucible-like shape by the centrifugal force. Then, an arc electrode was inserted into the quartz glass crucible body, the aperture part was covered with a platy lid body, and a high temperature gaseous atmosphere is provided inside inner cavity by using the arc electrode. Thus, a translucent quartz glass crucible base body was formed by cooling the molten and vitrified base body. Then, after setting high temperature atmosphere inside the translucent quartz glass crucible base body by means of arc electrode while rotating the mold, synthetic silica powder was supplied therein at a rate of 100 g/min from the silica powder supply nozzle. In this manner, a synthetic quartz glass inner layer about 2 mm in thickness was molten and joined monolithically with the inner surface of the translucent crucible base body. Subsequently, about 0.8 mm thick inner layer of naturally occurring quartz glass mixed with synthetic quartz glass was formed on the inner layer over a height range of 0.45 H to 0.9 H of the crucible base body by supplying synthetic silica powder at a rate of 50 g/min from the silica supply means 9 and naturally occurring silica powder at a rate of 50 g/min from the predetermined position through the silica supply nozzle above. The diameter of the thus obtained quartz glass crucible was 24 inches. On pulling up single crystal according to CZ method by filing the quartz glass crucible with polycrystalline silicon and melting, perfect single crystal was obtained after operation of about 90 hours without generating any vibration on the surface of silicon melt.

Comparative Example 1

By using the apparatus shown in FIG. 2, high purity naturally occurring silica powder subjected to purification treatment was fed into a rotating mold 7, and the powder was formed into a quartz glass crucible-like shape by the centrifugal force. Then, an arc electrode 13 was inserted into the quartz glass crucible base body, the aperture part was covered with a platy lid body 10, and a high temperature gaseous atmosphere was provided inside the inner cavity by using the arc electrode 13 to melt and vitrify the base body. Thus, a translucent quartz glass crucible base body 8 was formed by cooling the molten and vitrified body. Then, after setting high temperature atmosphere 15 inside the inner cavity of the translucent quartz glass crucible base body 8 by means of arc electrode 13 while rotating the mold 7, synthetic silica powder was supplied therein at a rate of 100 g/min. In this manner, a synthetic quartz glass inner layer about 2 mm in thickness was molten and joined monolithically with the inner surface of the translucent crucible base body 8. The diameter of the thus obtained quartz glass crucible was 24 inches. On pulling up single crystal according to CZ method by filling the quartz glass crucible with polycrystalline silicon and melting, vigorous vibration was generated on the surface of the silicon melt to find seeding operation and consecutive operations unfeasible.

Comparative Example 2

By using the apparatus shown in FIG. 2, high purity naturally occurring silica powder, subjected to purification treatment was fed into a rotating mold 7, and the powder was formed into a quartz glass crucible-like shape by the centrifugal force. Then, an arc electrode 13 was inserted into the quartz glass crucible base body, the aperture part was covered with a platy lid body 10, and a high temperature gaseous atmosphere was provided inside the inner cavity by using the arc electrode 13 to melt and vitrify the base body. Thus, a translucent quartz glass crucible base body 8 was formed by cooling the molten and vitrified body. Then, after setting high temperature atmosphere 15 inside the inner cavity of the translucent quartz glass crucible base body 8 by means of arc electrode 13 while rotating the mold 7, naturally occurring silica powder was supplied therein at a rate of 100 g/min. In this manner, a naturally occurring quartz glass inner layer about 2 mm in thickness was molten and joined monolithically with the inner surface of the translucent crucible base body 8. The diameter of the thus obtained quartz glass crucible was 24 inches. On pulling up single crystal according to CZ method by filling the quartz glass crucible with polycrystalline silicon and melting, perfect crystal was found unfeasible because disordering is generated on the single crystal after passage of about 50 hours, although no vibration is generated on the surface of the silicon melt.

The invention claimed is:

1. A quartz glass crucible for pulling up single crystal silicon, said crucible comprising a crucible base body having a bottom part having a lowest side and a side wall having an upper end plane, and an inner layer provided on an inner surface thereof, wherein said inner layer comprises:
   a) a first part consisting of a synthetic quartz extending from the bottom part to a height of at least 0.25 H;
   b) a second part made of a naturally occurring quartz glass or made of mixed quartz glass of naturally occurring and synthetic quartz glass, and extending in at least a range of from 0.5 H to 0.8 H; and
   c) a residual part made of quartz glass selected from the group consisting of synthetic quartz glass, naturally occurring quartz glass, and mixed quartz glass of naturally occurring and synthetic quartz glass,
   wherein H represents a height from the lowest side of the bottom part to the upper end plane of the wall.

2. A quartz glass crucible according to claim 1, wherein the mixed quartz glass of naturally occurring quartz glass and synthetic quartz glass is formed using a mixed powder of naturally occurring silica and synthetic silica in which the naturally occurring silica accounts for 30% or higher of the mixed powder.

3. A quartz glass crucible according to claim 1, wherein the second part has a thickness in a range of from 0.3 to 3 mm.

4. A quartz glass crucible according to claim 1, wherein the first part of the inner layer has a thickness in a range of from 0.5 to 5 mm.

* * * * *